United States Patent
Zhou et al.

(10) Patent No.: US 9,831,198 B2
(45) Date of Patent: Nov. 28, 2017

(54) INDUCTORS FOR INTEGRATED VOLTAGE REGULATORS

(71) Applicant: Nvidia Corporation, Santa Clara, CA (US)

(72) Inventors: Yaping Zhou, San Jose, CA (US); Huabo Chen, San Jose, CA (US); Wenjie Mao, Los Gatos, CA (US)

(73) Assignee: Nvidia Corporation, Santa Clara, CA (US)

( * ) Notice: Subject to any disclaimer, the term of this patent is extended or adjusted under 35 U.S.C. 154(b) by 119 days.

(21) Appl. No.: 13/973,799

(22) Filed: Aug. 22, 2013

(65) Prior Publication Data

US 2015/0054573 A1    Feb. 26, 2015

(51) Int. Cl.
| | |
|---|---|
| *H01F 5/00* | (2006.01) |
| *H01L 23/64* | (2006.01) |
| *H01F 27/28* | (2006.01) |
| *H01F 27/24* | (2006.01) |

(52) U.S. Cl.
CPC .............. *H01L 23/645* (2013.01); *H01F 5/00* (2013.01); *H01F 27/2804* (2013.01); *H01F 27/24* (2013.01); *H01F 2027/2814* (2013.01); *H01L 2224/4813* (2013.01); *H01L 2924/0002* (2013.01); *H01L 2924/19107* (2013.01)

(58) Field of Classification Search
CPC ........................ H01F 5/00; H01F 27/00–27/30
USPC ..................................... 336/65, 83, 200, 232
See application file for complete search history.

(56) References Cited

U.S. PATENT DOCUMENTS

| | | | |
|---|---|---|---|
| 2,800,621 A | 7/1957 | Carlson et al. | |
| 3,614,554 A * | 10/1971 | Shield | H01F 17/0033 257/531 |
| 5,177,431 A | 1/1993 | Smith et al. | |
| 5,254,878 A | 10/1993 | Olsen | |
| 5,543,773 A * | 8/1996 | Evans | H01F 27/2804 336/183 |
| 5,589,762 A | 12/1996 | Iannuzo | |
| 5,737,197 A | 4/1998 | Krichtafovitch et al. | |
| 5,847,552 A | 12/1998 | Brown | |
| 5,864,225 A | 1/1999 | Bryson | |
| 5,905,867 A | 5/1999 | Giorgio | |
| 6,014,066 A | 1/2000 | Harberts | |
| 6,043,634 A | 3/2000 | Nguyen et al. | |
| 6,249,039 B1 * | 6/2001 | Harvey | H01F 17/0006 257/528 |
| 6,310,393 B1 * | 10/2001 | Ogura | H01L 23/50 257/531 |

(Continued)

OTHER PUBLICATIONS

Patrick R. Morrow, Chang-Min Park, Henry W. Koertzen and J. Ted Dibene, II; "Design and Fabrication of On-Chip Coupled Inductors Integrated With Magnetic Material for Voltage Regulators"; IEEE Transactions On Magnetics, vol. 47, No. 6, Jun. 2011; 9 Pages.

(Continued)

*Primary Examiner* — Tuyen Nguyen

(57) ABSTRACT

An active component of an integrated voltage regulator (IVR) circuit is deployed within an IC device for regulating an operating voltage thereof. An interposer interconnects the IC device with a power source. A passive inductive component of the IVR circuit is deployed upon a surface of the IC device or the interposer. The inductive component has a magnetic core and a winding (e.g., wire-bond), wound about the magnetic core.

10 Claims, 5 Drawing Sheets

Pads and wires on interposer backside or topside

(56) References Cited

U.S. PATENT DOCUMENTS

| | | | |
|---|---|---|---|
| 6,369,557 B1 | 4/2002 | Agiman | |
| 6,441,597 B1 | 8/2002 | Lethellier | |
| 6,456,049 B2 | 9/2002 | Tsuji | |
| 6,462,950 B1 * | 10/2002 | Pohjonen | H01L 23/3677 257/706 |
| 6,512,285 B1 * | 1/2003 | Hashemi | H01L 23/645 257/531 |
| 6,667,603 B2 | 12/2003 | Hiraki et al. | |
| 6,815,938 B2 | 11/2004 | Horimoto | |
| 6,816,978 B1 | 11/2004 | Kaminski | |
| 6,831,448 B2 | 12/2004 | Ishii et al. | |
| 6,850,045 B2 | 2/2005 | Muratov et al. | |
| 6,909,268 B2 | 6/2005 | Kemahan et al. | |
| 6,979,980 B1 | 12/2005 | Hesterman et al. | |
| 6,979,982 B2 | 12/2005 | Herbert | |
| 7,071,660 B2 | 7/2006 | Xu et al. | |
| 7,078,884 B2 | 7/2006 | Miura et al. | |
| 7,122,995 B2 | 10/2006 | Hasegawa et al. | |
| 7,138,815 B1 | 11/2006 | Alexander et al. | |
| 7,145,383 B2 | 12/2006 | Mizuno | |
| 7,285,941 B2 | 10/2007 | Cha | |
| 7,441,137 B1 | 10/2008 | Mimberg | |
| 7,602,166 B1 | 10/2009 | Kang | |
| 7,649,434 B2 * | 1/2010 | Xu | H01F 37/00 336/212 |
| 7,849,332 B1 | 12/2010 | Alben et al. | |
| 7,882,369 B1 | 2/2011 | Kelleher | |
| 7,952,460 B2 * | 5/2011 | Joehren | H01F 17/0033 29/606 |
| 8,549,363 B2 | 10/2013 | Cher | |
| 9,092,048 B1 | 7/2015 | Owen | |
| 9,195,246 B2 | 11/2015 | Kahn | |
| 2004/0095119 A1 | 5/2004 | Kemahan et al. | |
| 2004/0263212 A1 | 12/2004 | Wald | |
| 2006/0088971 A1 * | 4/2006 | Crawford | H05K 1/165 438/381 |
| 2006/0143484 A1 | 6/2006 | Samson et al. | |
| 2006/0170402 A1 | 8/2006 | Banerjee et al. | |
| 2006/0170527 A1 * | 8/2006 | Braunisch | H01F 17/0006 336/223 |
| 2007/0165343 A1 | 7/2007 | Barowski et al. | |
| 2007/0186123 A1 | 8/2007 | Winbom | |
| 2008/0075974 A1 * | 3/2008 | Fajardo | C23C 18/31 428/692.1 |
| 2008/0229127 A1 | 9/2008 | Feller | |
| 2008/0244280 A1 | 10/2008 | Hutchison | |
| 2008/0247241 A1 | 10/2008 | Nguyen et al. | |
| 2008/0307240 A1 | 12/2008 | Dahan | |
| 2009/0091186 A1 | 4/2009 | Clemo et al. | |
| 2010/0077243 A1 | 3/2010 | Wang | |
| 2010/0265684 A1 | 10/2010 | Minegish | |
| 2011/0108947 A1 * | 5/2011 | Guzek | H05K 1/165 257/531 |
| 2012/0025796 A1 | 2/2012 | Kahn | |
| 2012/0042176 A1 | 2/2012 | Kim | |
| 2012/0062308 A1 | 3/2012 | Chakrabarty | |
| 2013/0009700 A1 | 1/2013 | Deboy | |
| 2013/0097450 A1 | 4/2013 | Patel | |
| 2013/0185584 A1 | 7/2013 | Hirairi | |
| 2013/0257564 A1 | 10/2013 | Huang | |
| 2014/0001639 A1 | 1/2014 | Hiraishi | |
| 2014/0167898 A1 * | 6/2014 | Sturcken | H01F 1/15316 336/170 |
| 2014/0176116 A1 | 6/2014 | Kumar | |
| 2014/0251669 A1 | 9/2014 | Manusharow | |
| 2014/0264732 A1 * | 9/2014 | Elsherbini | H01L 27/06 257/531 |
| 2014/0347025 A1 * | 11/2014 | Liao | H01L 28/10 323/282 |
| 2015/0022272 A1 | 1/2015 | Felix | |

OTHER PUBLICATIONS

Sturcken; et al.; "A 2.5D Integrated Voltage Regulator Using Coupled-Magnetic-Core Inductors on Silicon Interposer Delivering 10.8A/mm"; ISSCC 2012/Session23/ Advances in Heterogeneous Integration/23.1; 3 Pages.

Herzer, et al.; Capacitive-Coupled Current Sensing and Auto-Ranging Slope Compensation for Current Mode SMPS With Wide Supply and Frequency Range; IEEE; ESSCIRC; Sep. 2009; pp. 140-143; Texas Insruments; Freising, Germany.

Niaveen Verma, Analysis Toward Minimization of Total SRAM Energy Over Active and Idle Operating Modes, Journal, Sep. 2011, pp. 1695-1703, vol. 19 Issue No. 9, IEEE, USA.

Kevin Zhang, Faith Amzaoglu, Yih Wang, Low-Power SRAMS in Nanoscale CMOS Technologies, Journal, Jan. 2005, pp. 145-151, vol. 55 Issue No. 1, IEEE.

* cited by examiner

Pads and wires on chip backside

Pads and wires on interposer backside or topside

Example Voltage Regulating Method 60

| Regulate at least one characteristic of an operating voltage of an IC device, wherein the regulating is performed with an IVR, wherein an active component of the IVR is disposed within the IC device, and wherein an interposer interconnects the IC device with a power source.
61 |

↓

| Impede a change in a current with a passive inductive component of the IVR, which is disposed upon a surface of at least one of the IC device or the interposer, wherein the current change corresponds to a variation in the operating voltage, and wherein the inductive component includes a magnetic core and a wire bond winding, which is wound about the magnetic core.
62 |

FIGURE 6

Example Process 70 for Producing an IVR Circuit or a Related Assembly

| Electromechanically interconnect IC device, having active component IVR disposed within, to an interposer, which interconnects the IC device with a power source.
71 |

↓

| Electromechanically interconnect a passive inductive component of the IVR to a surface of at least one of the IC device or the interposer, wherein the passive inductive component includes a magnetic core and a wire bond winding, which is wound about the magnetic core and wherein the active IVR component and the wire bond passive inductive component are electrically inter-coupled.
72 |

FIGURE 7

INDUCTORS FOR INTEGRATED VOLTAGE REGULATORS

TECHNOLOGY

Embodiments of the present invention relate to electronic power supplies. More particularly, an example embodiment of the present invention relates to integrated voltage regulators.

BACKGROUND

Integrated circuit (IC) devices include the graphics processing unit (GPU) and central processor unit (CPU) components used in modern computers. A typical IC device comprises a semiconductor die. An array of active device components (e.g., transistors) configure logic gate, register and addressable memory cell components disposed within the die. The active components of the array are operably configured into circuitry, interconnected with a network of conductive traces, leads and vertical interconnect accesses (vias) routed throughout the die. The active components of the array interact with an exchange of data signals over the conductive network.

Conductive pads and leads may couple the IC device electrically to an interposer and therewith, to a printed circuit board (PCB) and one or more an external entities associated with the PCB. For example, the IC device may thus import and export data signals and couple with an external power source associated with the PCB. An operating voltage of the IC device may be regulated by an external voltage regulator entity with which it is thus coupled.

In general, sub-microscopic technology development is diminishing the physical dimensions of IC devices even as development in related technologies raises their switching and logic frequencies and power consumption. Smaller dimensions and faster logic and switching are particularly valuable in "mobile chips," which may comprise components in telephones, pad computers, personal digital assistants (PDA) and the like. However, greater switching frequencies and power consumption may degrade reliability and/or performance in devices with such small dimensions.

For instance, inductances introduced by conductive leads within an IC device may develop di/dt voltage drops, which may inject related noise ("di/dt noise"). The di/dt noise may reduce operating margins and switching speeds, which may constrain or limit the effective upper operating frequency that the IC device may achieve or sustain. Regulating an operating voltage of an IC device may mediate, ameliorate or at least partially prevent di/dt noise. Adequate voltage regulation may thus allow an IC device to achieve and sustain higher switching frequencies, reduce power loss, and generally improve performance.

In relation to external voltage control entities, an integrated voltage regulator (IVR) component allows an IC device faster response and/or finer grained control over its operating voltage. As an IVR is integrated within the array of active device components of the IC device itself, the IVR does not exchange voltage regulation related signals with entities external thereto (e.g., "off-chip" entities). Thus, as di/dv voltage drops may occur, e.g., from inductances internal to the IC device itself, an IVR provides fast response times to address di/dt noise as it may arise in relation thereto. Moreover, as voltage regulation related signals are not exchanged with off-chip entities, IVR components may actually deter, reduce or preclude the development of related di/dt noise. IC device IVR components also conserve PCB "real estate" or improve its spatial use efficiency. For instance, on-board area of the PCB may be used for components related to other than off-chip voltage regulation.

IVR (and indeed other voltage regulator) circuits may function with one or more power inductors, which function to reactively impede current changes over time for filtering di/dt noise and other transients. Typically, magnetic cores for conventional power inductors are implemented "on-chip," e.g., disposed in an IC device itself, or on a semiconductor interposer to which the IC device is connected. These approaches are described in one or more of the following references:

Morrow, et al., *Design and Fabrication of On-Chip Coupled Inductors Integrated with Magnetic Material for Voltage Regulators, IEEE Transactions on Magnetics* 47(6), 1678-1686, IEEE (2011);

Sturken, et al., *A 2.5D Integrated Regulator using Coupled Magnetic-Core Inductors on Silicon Interposer delivering 10.8 A/mm$^2$, IEEE ISSCC* 2012 *Session* 23 *Advances in Heterogeneous Integration*/23.1, 400-403, IEEE (2012).

Interposer-implemented conventional power inductors however demand additional fabrication process steps related to electroplating the inductors and surrounding magnetic material. Not only do the added process steps add complexity, cost, manufacturing time and failure probability, but the electroplating itself limits or constrains the selection of materials, e.g., metallurgically, chemically and/or electrically, that may be used, which may result in less than optimal fabrication or assembly outcomes.

While implementing conventional power inductors on an IC device with on-chip magnetic cores may add a degree of integration, the integration comes at the cost of a significant number of additional required fabrication process steps. The fabrication process also has compatibility requirements that constrain which magnetic materials may be selected for implementing the on-chip core. In addition to (or perhaps, partially because of) this constraint, conventional processes typically implement on-chip inductors with low inductance values (e.g., unless even additional costly efforts are taken to obviate using low on-chip inductances).

Further, conductor and dielectric losses typical of conventional on-chip inductors contribute significantly to effective resistance $R_e$ values thereof. These losses thus result in inductors with low quality factor values Q, which represents a ratio of the inductive reactance $X_L$ of the inductor to the effective resistance: $Q=X_L/R_e$.

Moreover, integrating the magnetic cores onto the IC device consumes or demands significant on-chip area or volume (e.g., real estate). Devoting on-chip real estate to the inductors renders at least that portion of the IC device unavailable for implementing transistors. The inductor, a single passive circuit component, thus effectively displaces multiple active circuit components, which may reduce an overall functional operability or performance capability of the IC device.

Approaches described in this Background section could, but have not necessarily been conceived or pursued previously. Unless otherwise indicated, neither approaches described in this section, nor issues identified in relation thereto, are to be assumed as recognized in any prior art merely by the discussion thereof within this section.

SUMMARY

It would be useful to implement an inductive element for regulating an operating voltage of an IC device without mounting discrete inductive components on a PCB. It would also be useful to an inductive element for regulating an operating voltage of an IC device without mounting discrete inductive components on the IC device, itself. Further, it would be useful to implement an inductive element for regulating an operating voltage of an IC device without mounting discrete inductive components on an interposer interconnecting the IC device and a PCB.

Example embodiments of the present invention relate to inductors for an integrated voltage regulator (IVR). An active component of an integrated voltage regulator (IVR) circuit is deployed within an IC device for regulating an operating voltage thereof. An interposer interconnects the IC device with a power source. A passive inductive component of the IVR circuit is deployed upon a surface of the IC device or the interposer. The inductive component has a magnetic core and a winding (e.g., wire-bond), wound about the magnetic core.

The interposer component and/or the IC component comprise at least a first surface and a second surface opposite from the first surface. The passive inductor component is disposed upon a surface of at least one of the interposer or the IC component.

In an example embodiment, the first surface of the IC device may be disposed over the first surface of the interposer or the second surface of the interposer component. The inductor component is disposed over the second surface of the IC component.

In an example embodiment, the first surface of the IC device is disposed over the first surface of the interposer or the second surface of the interposer. The inductor component is disposed, at least in part, over the second surface of the IC component, the first surface of the interposer and/or the second surface of the interposer.

The inductive component may comprise a first inductive element and at least a second inductive element. The winding comprises a first winding portion of the first inductive element and at least a second winding portion of the second inductive element electrically coupled therewith in at least one of a parallel configuration, or a series configuration. The series configuration may comprise an additive series configuration or a subtractive series configuration. The first winding portion and the second winding portion are each wound around at least a portion of the core.

Example embodiments of the present invention described herein also relate to a method for regulating a voltage, a voltage regulating circuit, an electronic assembly, and to processes for producing circuits and electronic assemblies.

Thus, an example embodiment of the present invention relates to an IVR circuit. An example embodiment implements an inductive element for regulating an operating voltage of an IC device without mounting discrete inductive components on a PCB. An example embodiment implements an inductive element for regulating an operating voltage of an IC device without mounting discrete inductive components on the IC device, itself. Further, an example embodiment implements an inductive element for regulating an operating voltage of an IC device without mounting discrete inductive components on an interposer interconnecting the IC device and a PCB.

BRIEF DESCRIPTION OF THE DRAWINGS

The accompanying drawings described in this section comprise a part of the specification herein of example embodiments of the present invention and are used for explaining features, elements and attributes thereof. Principles of example embodiments are described in relation to each figure of these drawings, in which like numbers are used to reference like items and in which:

FIG. 6 depicts a flowchart of an example method for controlling an operating voltage, according to an embodiment of the present invention; and FIG. 7 depicts a flowchart of an example process for producing an IVR circuit, according to an embodiment of the present invention.

Figure 1A:
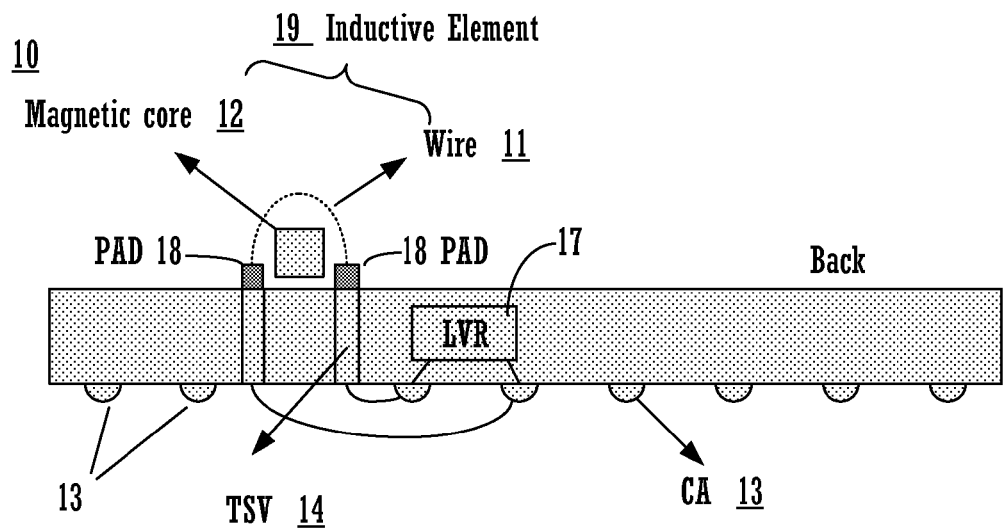
FIG. 1A and FIG. 1B respectively depict a side view and a top view of an example IVR circuit, according to an embodiment of the present invention.

The figures are drawn to no particular scale (unless specified otherwise in the description).

DESCRIPTION OF EXAMPLE EMBODIMENTS

Overview, Notation and Nomenclature

Example embodiments of the present invention relate to inductors for an integrated voltage regulator (IVR). Example embodiments of the present invention relate to inductors for an integrated voltage regulator (IVR). An active component of an integrated voltage regulator (IVR) circuit is deployed within an IC device for regulating an operating voltage thereof. An interposer interconnects the IC device with a power source. A passive inductive component of the IVR circuit is deployed upon a surface of the IC device or the interposer. The inductive component has a magnetic core and a winding (e.g., wire-bond), wound about the magnetic core.

Reference will now be made in detail to implementations of the example embodiments as illustrated in the accompanying drawings. The same reference numbers will be used to the extent possible throughout the drawings and the following description to refer to the same or like items. The drawings are not rendered to a particular scale, unless specifically mentioned otherwise herein. It will be apparent to artisans of ordinary skill in technologies that relate to semiconductors however, that example embodiments of the present invention may be practiced without some of these specifically described details. Example embodiments of the present invention are described in relation to an IVR circuit.

For focus, clarity and brevity, as well as to avoid unnecessarily occluding, obscuring, obstructing or obfuscating features that may be somewhat more germane to, or significant in explaining example embodiments of the present invention, this description may avoid discussing some well-known processes, structures, components and devices in exhaustive detail. Artisans of ordinarily skilled in electronics and semiconductor related technologies should realize that the following description is made for purposes of explanation and illustration and is not intended to be limiting in any way. On the contrary; other embodiments should readily suggest themselves to artisans of such skill in relation to the example features and elements described herein and any corresponding benefits such embodiments may achieve.

An example embodiment of the present invention is described in relation to an IVR circuit for an IC device, such as a GPU or a CPU. While embodiments are described herein with reference to example IC devices and electronic assemblies, it should be appreciated that this is by way of illustration, example, clarity, brevity and simplicity of description and not for any limiting purpose. Moreover, artisans of ordinary skill in electronic and semiconductor technologies should realize, appreciate and understand that the scope of embodiments of the present invention is broader than the examples described herein. For example, skilled artisans in these fields should realize that the scope covers regulating the operating voltages of other IC devices and assemblies in which integrated voltage regulating components may be disposed.

Example Circuits, Assemblies and Products

Figure 1B:
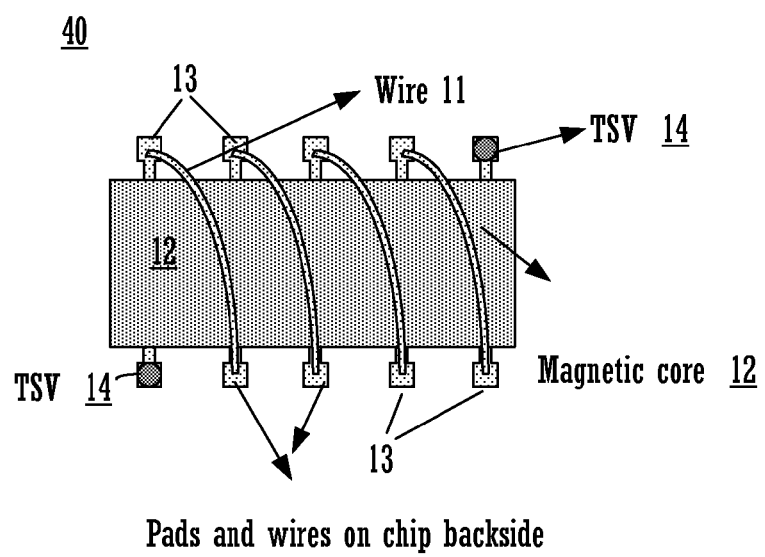

Example embodiments of the present invention relate IVR circuits, to devices such as ICs that have IVR circuits and to assemblies that include such devices. An example embodiment of the present invention is described in relation to inductors for an IVR. FIG. 1A and FIG. 1B respectively depict a side view and a top view of an example IVR circuit 10, according to an embodiment of the present invention.

An active voltage regulating component of IVR circuit 10 has an array of active devices (e.g., transistors for logic and memory operations) 17 disposed within an integrated circuit (IC) device 15. The array of active devices of IVR component 17 is operable for regulating an operating voltage of the IC device 15, which may be interconnected to a power source with an interposer or the like with one or more of conductors 13. Conductors 13 may include solder balls disposed on a ball grid array (BGA), a C4 array or the like.

A passive inductive element (e.g., component) 19 is disposed upon a surface of the IC device. The passive inductive component 19 has a magnetic core 12 mounted upon a surface of the IC device 15 and a winding 11, wound about the magnetic core 12. An example embodiment is implemented wherein the winding 11 comprises a wire-bond winding. In relation to inductors characteristic of conventional IVRs, implementing the winding 11 with wire-bond technology according to an example embodiment of the present invention reduces conductor loss. Further in relation to inductors characteristic of conventional IVRs, mounting the magnetic core upon a surface of the IC device (or an interposer) according to an example embodiment of the present invention reduces dielectric loss. Reducing conductor loss and reducing dielectric loss each reduce the effective resistance $R_e$, and thus raises the quality factor Q of the passive inductive element 19 in relation to conventional IVRs.

At least a pair of the conductors 13 electrically couples the active IVR component 10 and one end of a pair of opposite ends of the wire bond winding 11 of passive inductive component 19. An example embodiment may be implemented in which the pair of the conductors 13 runs through one or more vias. One or more of the multiple vias may be routed through the semiconductor die of IC device, which may be referred to herein as a through-silicon via (TSV).

An example embodiment may be implemented in which the IVR circuit 10 comprises a part of an electronic assembly. As depicted in FIG. 1A, the assembly includes the IC device 15 as a component, having a first surface and a second surface opposite therefrom. The assembly has and an integrated voltage regulator (IVR) component disposed within the IC device 15. Multiple conductive interconnects 13 comprise a conductor component arrayed over the first surface of the IC. At least a portion of the multiple conductive interconnects 13 are operable for electrically coupling the IC device to a power source. An array of conductive pads 18 are disposed on the second surface of the IC device 15, in which at least a pair of the pads is electrically coupled to the IVR component 17 with at least a pair of conductive leads. An inductive component 19 comprises a magnetically permeable core 12 such as a ferrite or a material with ferrimagnetic properties (e.g., copper, gold, aluminum). The wire bond winding 11 is wound about the magnetically permeable core and coupled at each end to one of the pads of the at least the pair of pads.

In an example embodiment, the inductive component 12 is disposed upon the second surface of the IC device 15. A first end of the pair of conductive leads 13 is electrically coupled to the IVR 17 and a second end of the conductive leads is electrically coupled to the wire bond winding 11 to interconnect the IVR 17 and the inductive component 19. The inductive component may comprise a solenoid element.

Figure 2A:
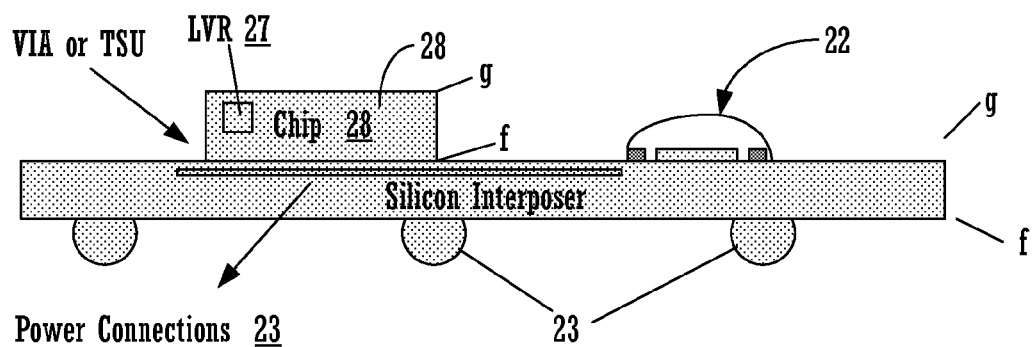
FIG. 2A and FIG. 2B respectively depict a side view and a top view of an example IVR circuit, according to an embodiment of the present invention.
Figure 2B:
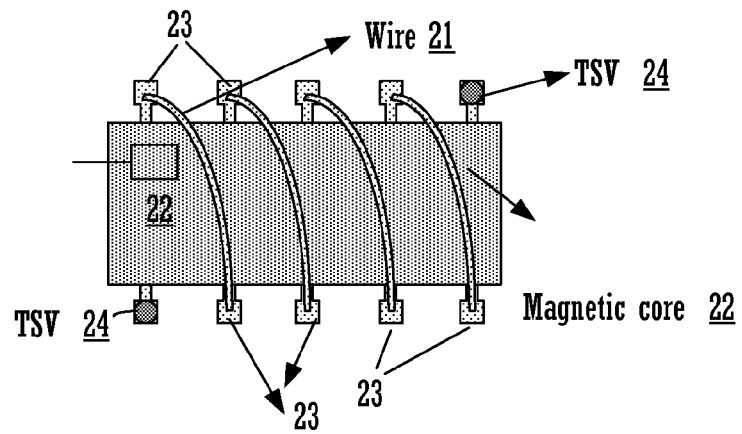

In another example embodiment, the inductive component of an IVR circuit (or at least a part of an inductive element having multiple inductive components) may (e.g., alternatively, additionally in part) be disposed upon an interposer, with which the IC device may be interconnected (e.g., electrically coupled, attached). FIG. 2A and FIG. 2B respectively depict a side view and a top view of an example IVR circuit 20, according to an embodiment of the present invention.

IVR circuit 20 includes an IC device 28, electrically coupled and fastened or affixed (e.g., electromechanically connected) to a first (e.g., upper) surface of an interposer 25. Interposer 25 has a silicon (or another semiconductor) substrate with multiple conductors 29 disposed therein.

An active voltage regulating component 27 of IVR circuit 20 has an array of active devices disposed within an IC device 28. The array of active devices of IVR component 27 is operable for regulating an operating voltage of the IC device 28, which interposer 25 may interconnect to a power source with one or more of the multiple conductors 23. Conductors 23 may include solder balls disposed on a ball grid array (BGA), a C4 array or the like, disposed over a second (e.g., bottom) surface of the interposer 25.

An example embodiment may be implemented wherein a passive inductive element (e.g., component) 29 is disposed upon the first surface of the interposer 25. The inductive component 29 has a magnetic core 22 mounted upon the surface of the interposer 25 and a winding 21, wound about the magnetic core 22. An example embodiment is implemented wherein the winding 21 comprises a wire-bond winding. In relation to inductors characteristic of conventional IVRs, implementing the winding 21 with wire-bond technology according to an example embodiment of the present invention reduces conductor loss. Further in relation to inductors characteristic of conventional IVRs, mounting the magnetic core upon a surface of the interposer 25 (or of an IC device) according to an example embodiment of the present invention reduces dielectric loss. Reducing conductor loss and reducing dielectric loss each reduce the effective resistance $R_e$, and thus raises the quality factor Q of the passive inductive element 29 in relation to conventional IVRs.

At least a pair of the conductors 23 electrically couples the IVR component 17 and one of a pair of opposite ends of the winding 21 of inductive component 29. An example embodiment may be implemented in which the pair of the conductors 23 runs through one or more vias 24. One or more of the multiple vias 24 may comprise a TSV, routed through the interposer 25.

An example embodiment of the present invention thus relates to an electronic assembly that includes the interposer 25. The assembly includes a number of the electrical connections 23, which may be disposed upon and/or within (e.g., with one or more of the vias and/or the TSVs) a semiconductor die or substrate of the interposer 25. At least the at least the pair of the pads is electrically coupled to at least two of the plurality of electrical connections 23.

In an example embodiment of the present invention the interposer comprises a first surface and a second surface opposite from the first surface wherein the IC component and the inductive component are both disposed on at least one of the first surface or the second surface of the interposer.

Figure 3:
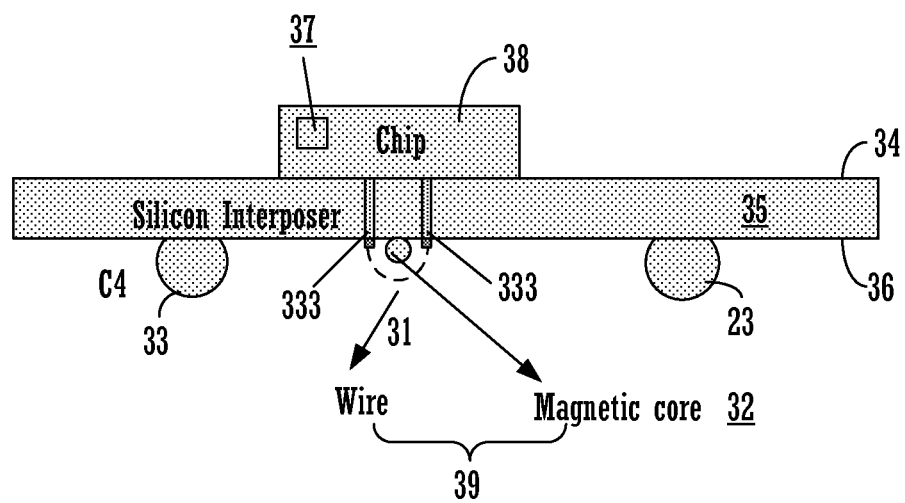
FIG. 3, FIG. 4 and FIG. 5 each depict an example IVR circuit, according to an embodiment of the present invention.

FIG. 3 depicts an example IVR circuit 37 and an example electronic assembly 30, according to an embodiment of the present invention. The IVR circuit 37 is disposed within an IC device component 38 of the assembly 30 and is operable for regulating an operating voltage of the IC device. An interposer 35 has a first surface 34 and a second surface 36, which is opposite from the first surface 34.

An example embodiment may be implemented in which the IC component 38 is disposed on at least one of the first surface 34 of the interposer 38 or the second surface thereof and a passive inductive component 39 is disposed on the second surface 36 of the interposer 35. Alternatively, an example embodiment may be implemented in which the IC component 38 is disposed on the second surface 36 of the interposer 38 and the passive inductive component 39 is disposed on the first surface 34 of the interposer 35, which is opposite from the surface 36 upon which the IC component 35 is disposed. Example embodiments may also be implemented in which the inductive element comprises multiple inductor components, which may be disposed at least in part on one or more of the first surface 34 or the second surface 36 of the interposer 35. The assembly 30 includes a number of the electrical connections 33, which may be disposed upon a surface of the interposer 35 or routed through a semiconductor die or substrate of the interposer with one or more of vias and/or TSVs 333.

The magnetic core 32 of the passive inductive component 39 is mounted upon a surface of the interposer 35 and a winding 21, wound about the magnetic core 32. An example embodiment is implemented wherein the winding 31 comprises a wire-bond winding. In relation to inductors characteristic of conventional IVRs, implementing the winding 31 with wire-bond technology according to an example embodiment of the present invention reduces conductor loss. Further in relation to inductors characteristic of conventional IVRs, mounting the magnetic core upon a surface of the interposer 35 (or of an IC device) according to an example embodiment of the present invention reduces dielectric loss. Reducing conductor loss and reducing dielectric loss each reduce the effective resistance $R_e$, and thus raises the quality factor Q of the passive inductive element 39 in relation to conventional IVRs.

Figure 4:
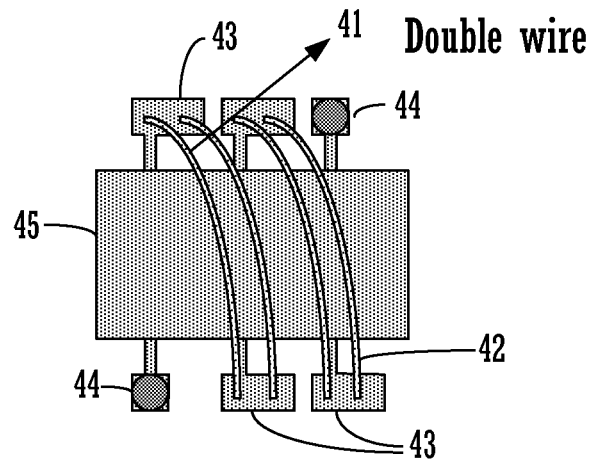

FIG. 4 depicts an example passive inductive element 40 for an IVR circuit, according to an embodiment of the present invention. The inductive element 40 may be disposed on a surface of an IC device or either of opposite surfaces of an interposer to which the IC device may be connected, e.g., as described above with reference to FIG. 1A-FIG. 3.

The passive inductive element 40 has an a first winding 41 wound helically around an inductive core component 45 and a second winding 42, also wound helically around the inductive core component 45. The second winding 42 is configured electrically in parallel with the first winding 41. The parallel windings 41 and 42 may be electrically coupled using one or more of the pads 43 and/or routed through the IC device or interposer with vias 44 to couple with an IVR circuit component. The parallel windings allow the inductive component to handle higher current levels than a single winding alone of the same gauge would support. An example embodiment may also be implemented, in which at least two inductive elements are configured in parallel.

In an example embodiment, the magnetic core 45 of the inductive element 40 is mounted upon a surface of an interposer or a surface of an IC device and the first and second windings 41 and 42 are wound about the magnetic core 45. An example embodiment is implemented wherein the first and/or second windings 41 and 42 comprise a wire-bond winding. In relation to inductors characteristic of conventional IVRs, implementing the windings 41 and/or 42 with wire-bond technology according to an example embodiment of the present invention reduces conductor loss. Further in relation to inductors characteristic of conventional IVRs, mounting the magnetic core upon a surface of an interposer or a surface of an IC device according to an example embodiment of the present invention reduces dielectric loss. Reducing conductor loss and reducing dielectric loss each reduce the effective resistance $R_e$, and thus raises the quality factor Q of the passive inductive element 40 in relation to conventional IVRs.

Figure 5:
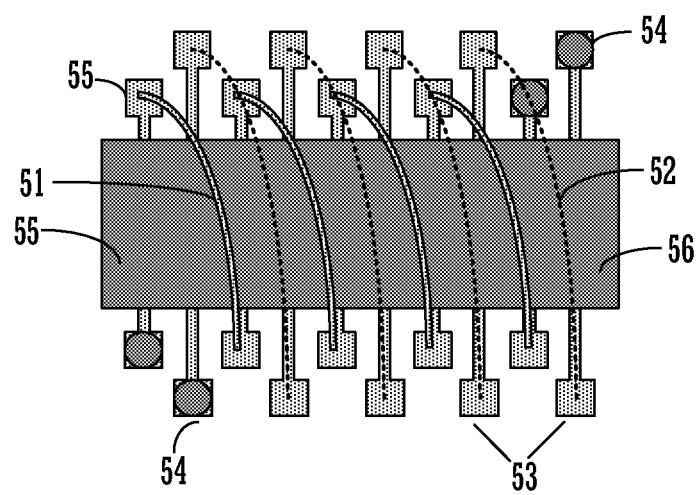

FIG. 5 depicts an example inductive element 50 for an IVR circuit, according to an embodiment of the present invention. The inductive element 50 has a first magnetically permeable inductive core component 55 and at least a second magnetically permeable inductive core component 56. The first core component 55 includes, at least in part, at least a portion of the second core component. An end of the winding of the first inductive component may be electrically coupled to an end of the winding of the second inductive component in an additive configuration or in a subtractive configuration.

The inductive core components may thus be coupled, e.g., in an end-to-end configuration or over a part of their longitudinal axes. Coupled inductors allow an IVR circuit with transient response times faster than may be supported with single IVR circuits. Example embodiments may be implemented in which the coupled inductors are disposed on a surface of an IC device or over either surface of an interposer to which the IC device is connected (e.g., as described above with reference to FIG. 1A-FIG. 3).

In an example embodiment, the magnetic core components 55 and 56 of the inductive element 50 are mounted upon a surface of an interposer or a surface of an IC device and the first and second windings 51 and 52 are wound about the magnetic core components 55 and 56, e.g., in an additive or a subtractive configuration relative to each other. An example embodiment is implemented wherein the first and/or second windings 51 and 52 comprise a wire-bond winding. In relation to inductors characteristic of conventional IVRs, implementing the windings 51 and/or 52 with wire-bond technology according to an example embodiment of the present invention reduces conductor loss. Further in relation to inductors characteristic of conventional IVRs, mounting the magnetic core upon a surface of an interposer or a surface of an IC device according to an example embodiment of the present invention reduces dielectric loss. Reducing conductor loss and reducing dielectric loss each reduce the effective resistance $R_e$, and thus raises the quality factor Q of the passive inductive element 50 in relation to conventional IVRs.

Example Voltage Regulating Method

FIG. 6 depicts a flowchart of an example method 60 for controlling a voltage, according to an embodiment of the present invention. In step 61, at least one characteristic of an operating voltage of an IC device is regulated, wherein the regulating is performed with an IVR, wherein an active component of the IVR is disposed within the IC device, and wherein an interposer interconnects the IC device with a power source.

In step 62, a change in a current is impeded with a passive inductive component of the IVR, which is disposed upon a surface of at least one of the IC device or the interposer, wherein the current change corresponds to a variation in the operating voltage, and wherein the passive inductive component includes a magnetic core and a wire bond winding, which is wound about the magnetic core. Each of a pair of conductors electrically couples the active component of the IVR and one end of a pair of opposite ends of the wire bond winding of the passive inductive component.

Example Process for Producing Circuits

FIG. 7 depicts a flowchart of an example process 70 for producing an IVR circuit and/or a related electronic assembly, according to an embodiment of the present invention. In step 71, a IC device having an active IVR circuit component disposed therein is electromechanically interconnected (e.g., electrically coupled and mechanically fastened, mounted or affixed) to an interposer, which interconnects (e.g., electrically couples) the IC device and a power source.

In step 72, a passive inductive component of the IVR circuit is disposed upon a surface of at least one of the IC device or the interposer, wherein the passive inductive component includes a magnetic core and a wire bond winding, which is wound about the magnetic core. Each of a pair of conductors may electrically inter-couple the active component of the IVR and one end of a pair of opposite ends of the wire bond winding of the passive inductive component.

Thus, an example embodiment of the present invention relates to an IVR circuit and related IC devices and electronic assemblies therewith. Example embodiments of the present invention relate to inductors for an integrated voltage regulator (IVR). An active component of an integrated voltage regulator (IVR) circuit is deployed within an IC device for regulating an operating voltage thereof. An interposer interconnects the IC device with a power source. A passive inductive component of the IVR circuit is deployed upon a surface of the IC device or the interposer. The inductive component has a magnetic core and a winding (e.g., wire-bond), wound about the magnetic core.

Thus, an example embodiment of the present invention relates to an IVR circuit. An example embodiment implements an inductive element for regulating an operating voltage of an IC device without mounting discrete inductive components on a PCB. An example embodiment implements an inductive element for regulating an operating voltage of an IC device without mounting discrete inductive components on the IC device, itself. Further, n example embodiment implements an inductive element for regulating an operating voltage of an IC device without mounting discrete inductive components on an interposer interconnecting the IC device and a PCB.

Definitions that are expressly set forth in each or any claim specifically or by way of example herein, for terms contained in relation to features of such claims are intended to govern the meaning of such terms. Thus, no limitation, element, property, feature, advantage or attribute that is not expressly recited in a claim should limit the scope of such claim in any way. The specification and drawings are, accordingly, to be regarded in an illustrative rather than a restrictive sense.

Example embodiments of the present invention are thus described in relation to an IVR circuit and related IC devices and electronic assemblies, methods for regulating a voltage, and processes for producing IVR circuits and related electronic assemblies. In the foregoing specification, example embodiments of the present invention are described with reference to numerous specific details that may vary between implementations. Thus, the sole and exclusive indicator of that, which embodies the invention, and is intended by the Applicants to comprise an embodiment thereof, is the set of claims that issue from this application, in the specific form in which such claims issue, including any subsequent correction.

What is claimed is:

1. An electronic assembly, comprising:
   an integrated circuit (IC) component; comprising an active element of an integrated voltage regulator (IVR), wherein the IVR is operable to regulate an operating voltage of the IC component; and
   an inductor component; comprising a passive element of the IVR and disposed external to the IC component, wherein the inductor component comprises:
   a magnetically permeable core mounted on a first surface of the IC component; and
   a winding wound about the magnetically permeable core.

2. The electronic assembly as recited in claim 1 wherein the magnetically permeable core comprises a ferrimagnetic material.

3. The electronic assembly as recited in claim 2 wherein the ferrimagnetic material comprises a ferrite.

4. The electronic assembly as recited in claim 1 wherein the winding comprises a wire-bond conductor.

5. The electronic assembly as recited in claim 4 wherein the wire-bond conductor comprises one or more of copper, gold and aluminum.

6. The electronic assembly as recited in claim 4 further comprising conductive pads disposed on the first surface of the IC component, and wherein the wire-bond conductor is coupled to the IC component through the conductive pads.

7. A system comprising:
   an integrated circuit (IC) component comprising a first part of an integrated voltage regulator (IVR), wherein the first part is integrated within the IC component, wherein the IVR is configured to regulate an operating voltage of the IC component;
   a second part of the IVR coupled to said first part and disposed external of the integrated circuit component, wherein the second part comprises a magnetic core of an inductor, wherein the magnetic core is mounted on a surface of the IC component.

8. The system of claim 7, wherein the second part further comprises a first winding that is wound about the magnetic core.

9. The system of claim 8, wherein the magnetic core comprises a ferrimagnetic material, and wherein further the first winding comprises a wire-bond conductor.

10. The system of claim 9, wherein the wire-conductor is coupled to the IC component through conductive pads on the surface of the IC component.

* * * * *